United States Patent
Gross

(12) United States Patent (10) Patent No.: US 6,458,696 B1
Gross (45) Date of Patent: Oct. 1, 2002

(54) PLATED THROUGH HOLE INTERCONNECTIONS

(75) Inventor: Michal Edith Gross, Somerset, NJ (US)

(73) Assignee: Agere Systems Guardian Corp, Orlando, FL (US)

( * ) Notice: Subject to any disclaimer, the term of this patent is extended or adjusted under 35 U.S.C. 154(b) by 0 days.

(21) Appl. No.: 09/833,251

(22) Filed: Apr. 11, 2001

(51) Int. Cl.[7] ............... H01L 21/44; C25D 5/02; C25D 7/04; C25D 7/12
(52) U.S. Cl. ............... 438/668; 438/667; 205/131; 205/151; 205/157
(58) Field of Search ............... 438/666, 667, 438/668; 205/107, 122, 131, 132, 151, 157, 159

(56) References Cited

U.S. PATENT DOCUMENTS

| | | | | |
|---|---|---|---|---|
| 4,610,077 A | * | 9/1986 | Minahan et al. | 29/572 |
| 4,978,639 A | * | 12/1990 | Hua et al. | 437/230 |
| 5,166,097 A | * | 11/1992 | Tanielian | 437/203 |
| 5,599,744 A | * | 2/1997 | Koh et al. | 437/195 |
| 5,681,444 A | * | 10/1997 | Azzaro et al. | 205/125 |
| 5,733,468 A | * | 3/1998 | Conway, Jr. | 216/21 |
| 5,804,422 A | * | 9/1998 | Shimizu et al. | 438/125 |
| 5,985,521 A | * | 11/1999 | Hirano et al. | 430/314 |
| 2001/0023830 A1 | * | 9/2001 | Inoue et al. | 205/107 |

\* cited by examiner

*Primary Examiner*—Richard Booth
*Assistant Examiner*—Viktor Simkovic
(74) *Attorney, Agent, or Firm*—Peter V. D. Wilde; Thomas, Kayden, Horstemeyer & Risley LLP

(57) ABSTRACT

The specification describes interconnection techniques for interconnecting large arrays of micromechanical devices on a silicon platform. Interconnections are routed through vias extending through the thickness of the substrate. The vias are formed by etching holes through the silicon wafer, depositing an insulating layer on the sidewalls of the holes, depositing a barrier layer on the insulating layer, electrolytically depositing a metal selected from the group consisting of copper and nickel to form via plugs in the holes, and depositing another barrier layer over the via plugs. It is found that electrolytic deposition will successfully plug the holes even when the aspect ratio of the through holes is greater than four and the hole diameter less than 100 microns.

14 Claims, 12 Drawing Sheets

PLATED THROUGH HOLE INTERCONNECTIONS

FIELD OF THE INVENTION

This invention relates to electronic assembly technology and more specifically to interconnections on semiconductor wafers.

BACKGROUND OF THE INVENTION

A sophisticated and widely used interconnection technology has been developed for connecting one electrical site on a semiconductor wafer to another. Typically these interconnections involve connecting the active elements of a semiconductor device, e.g. source, drain, gate, to each other, or to another device, or to a runner that interconnects to another level. In early device technology, and in some simple large area devices in current production, these interconnections are made on a single level on the surface of the semiconductor wafer. As device dimensions have been reduced, and the complexity of interconnections increased, multiple level interconnections were developed. These are stacked on the semiconductor wafer surface over the active devices. Three or even four levels of interconnection are not uncommon.

Recently, new technologies have arisen where one or more interconnect levels are formed directly on the semiconductor surface, and the active device is located above the interconnect levels. However, in both of these cases all of the device structure, including the interconnections, are located on the same side of the wafer.

New photonic devices are in development that use micromechanical elements. In principle micromechanical elements can be built on a variety of platforms, not necessarily semiconductor platforms. However, highly and often elegantly engineered silicon processing can be used to make new device structures that combine mainly the mechanical and optical properties of silicon. Consequently, so-called silicon optical bench technology has evolved in which the platform for the micromechanical devices or subassemblies is a silicon wafer, or a large silicon chip.

Among the most promising of the photonic micromechanical devices are optical switches. These devices typically comprise mirrors, and the mirrors operate as moving parts. The movement of the mirrors in these devices may be effected by magnetic or electric fields, both activated using electrical circuitry. To date, the electrical circuits have been built around the micromechanical elements to interconnect them together. As the size of the micromechanical arrays, and the number of devices per wafer, increases, the electrical circuits that drive them become more complex. The usual option when confronted with increased complexity is to build interconnect layers on top of the active structures, as in state of the art IC technology. However, with micromechanical mirror arrays, this option is limited by both the need for movement of the micromechanical elements and the need for accessing these elements, e.g., mirrors, with optical beams. The solution to interconnect congestion in large micro-mirror arrays to date has been to increase the platform area.

To overcome this serious limitation an interconnect technology for micromechanical devices has been developed in which the micromechanical elements are located on the top side of the silicon wafer platform but most of the interconnection for the electrical circuits that drive the micromechanical elements is located on the backside, i.e. bottom side, of the silicon wafer. For more details of this technology, see U.S. application Ser. No. 09/578,894, filed May 26, 2000, which application is incorporated herein in its entirety for relevant details.

The interconnect strategy of the aforementioned application leads to several important advantages. It provides more area for interconnections. It allows effective use of multi-level interconnect layers. It provides space, with concomitant short interconnections, for attachment of active drive IC devices. It removes a source of stray electromagnetic fields from the top surface, where the electrostatic drive elements for mirror tilt are susceptible to unwanted interactions, to the bottom surface remote from the mirror tilt apparatus. An important aspect of this new technology is that the interconnections are made using through holes that extend from the front side of the silicon wafer to the backside through the thickness of the silicon wafer. However, a contradiction in design is raised by three considerations: 1. the silicon wafer should be relatively thick to have sufficient mechanical robustness for handling and supporting the mechanical apparatus; 2. the through holes should have as small a diameter as possible to allow optimum miniaturization of the micromechanical elements and the interconnections for those elements; 3. the through holes need to be large enough to accommodate both an insulating layer and a conductor plug, and also need to be large enough to allow for processing through the entire thickness of the wafer in forming the insulating layer and the conductive plug. The latter problem will be appreciated from the fact that the two former requirements result in hole aspect ratios typically greater than 4, which is widely regarded by workers in the art as a severe constraint on process design choice. The usual wafer thickness for micromechanical device platforms is at least 500 $\mu$m, and the through hole diameter requirement is less than 125 $\mu$m. Both the relative dimensions quoted, i.e. the aspect ratio, and the absolute dimensions, are important. As the (absolute) diameter is reduced below 125 $\mu$m the options for processing high aspect ratio holes become limited. One useful option is described in the application referenced above. It is to coat the walls of the through hole with thermally grown oxide, and fill the coated holes with CVD polysilicon. Both of these are vapor phase processes, which are expected to be the choice of the process designer in view of the limitations due to the high aspect ratio of the through holes. The choice of polysilicon as the fill material is advantageous for thermo-mechanical integrity of the wafer. However, it is known that the deposition of very thick films of heavily doped polysilicon is a slow process. Moreover, the conductivity of polysilicon, while acceptable, is not ideal. It would be desirable to fill the through holes with a more conductive interconnection material.

SUMMARY OF THE INVENTION

It has been discovered, unexpectedly, that an electrolytic process is effective for coating the entire surface of through holes having very small diameters, e.g. 20 to 150 $\mu$m, and very high aspect ratios, e.g. greater than 4. This allows electroplating of high aspect through holes with copper or nickel.

DETAILED DESCRIPTION

To provide a practical context for the process of the invention a micromechanical photonic switching array will be described. As will become evident, this device requires through hole interconnections having the requirements described above, i.e. very small holes with very high aspect ratios. Other practical applications may arise in electronics technologies that have similar requirements. The invention is equally applicable to those. However, the technology implicit in the description of the micromechanical devices is especially demanding, and the technique for providing through hole interconnections for this device represents a preferred embodiment of the invention.

Figure 1:
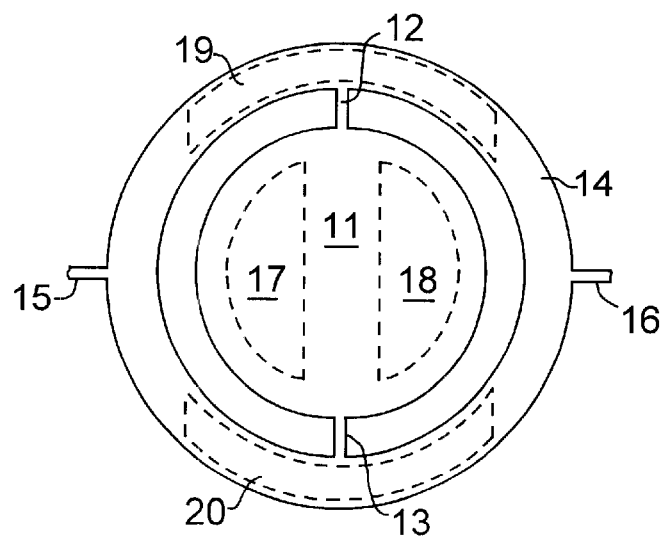
FIG. 1 is a schematic view of a micromechanical subassembly, in this embodiment a mirror with four way tilt for an optical cross connect, that is adapted for the interconnection system of the invention.

Referring to FIG. 1, a micromechanical mirror with four way tilt capability comprises mirror surface 11, flexibly suspended from support arms 12 and 13. The support arms are attached to gimbal ring 14, which in turn is flexibly suspended by support arms 15 and 16 from a fixed support (not shown). The drive electrodes for this device are shown in phantom. The electrodes controlling two way tilt for mirror 11 are shown at 17 and 18, and the electrodes for controlling two way tilt for gimbal ring 14 are shown at 19 and 20. The two way tilt capability for the mirror and the two way tilt capability for the gimbal combine to produce four way tilt capability for the mirror. Control of the tilt is effected electrostatically by application of voltages selectively to electrodes 17–20. This normally requires that each of the four electrodes be independently addressable. An array of n devices, requires 4n independent electrical interconnections. In principle, fewer electrical connections can be used but the preferred choice is that shown.

In an optical cross connect, the mirrors in the array communicate with optical waveguides. These waveguides, and the overall system architecture, are not part of the invention and for simplicity in presenting the invention are not shown. However, it is well known that optical cross connects in the form of mirror arrays require compact mirror arrays, i.e., close packing of the mirrors, for efficient design of the overall system.

Figure 2:
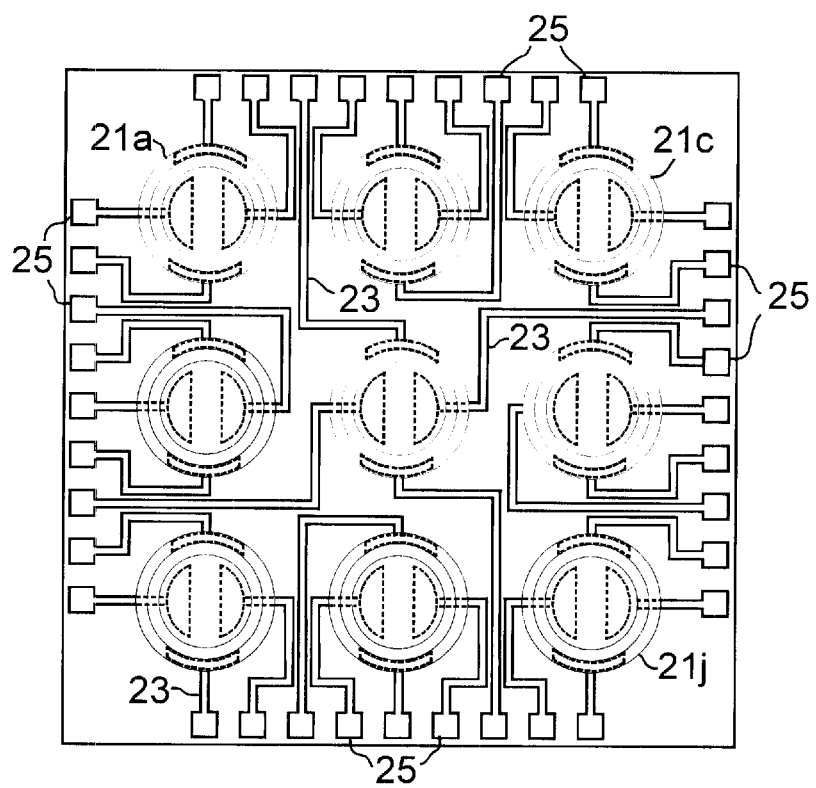
FIG. 2 is a schematic representation of a silicon wafer platform with micro-mechanical elements and interconnect circuits located on the same side of the silicon wafer.

An array of 3×3 micromechanical devices of FIG. 1 is shown in FIG. 2. The nine micromechanical mirrors are shown as 21a–21j. Runners 23 interconnect the four electrodes for each device 21a–21j to bond pads 25. This interconnection requires a total of 36 individual runners and bond pads for the 3×3 array.

The size, 3×3, of the array is chosen here for convenience in illustrating the interconnection implications of large micromechanical device arrays. Device arrays in current development may be much larger, e.g. hundreds or even thousands of micromechanical devices on a single silicon platform. As the number of micromechanical devices is multiplied, the required interconnect area for a given runner pitch increases dramatically, and the size of the substrate platform needed to accommodate the interconnections quickly becomes prohibitive. Moreover, the spacing between the mirror elements must be enlarged significantly, as can be inferred from FIG. 2, to allow space for the electrode interconnections. In the relatively small array shown, the space between micromechanical mirror devices accommodates three runners. In a corresponding 10×10 array, the space between micromechanical mirror devices at the edge of the array would be increased to accommodate ten runners. For some state of the art applications, hundreds, or even thousands, of devices are needed in a single array.

The micromechanical mirror device is given by way of example only of a wide variety of electrically driven micromechanical elements that may be fabricated in large arrays on a common substrate. It is presented for illustration of the problems associated with electrically interconnecting large micromechanical device arrays for which mechanical movement and optical access is incompatible with traditional multilevel printed circuit interconnection approaches. Other micromechanical devices may require fewer or more interconnections.

Figure 3:
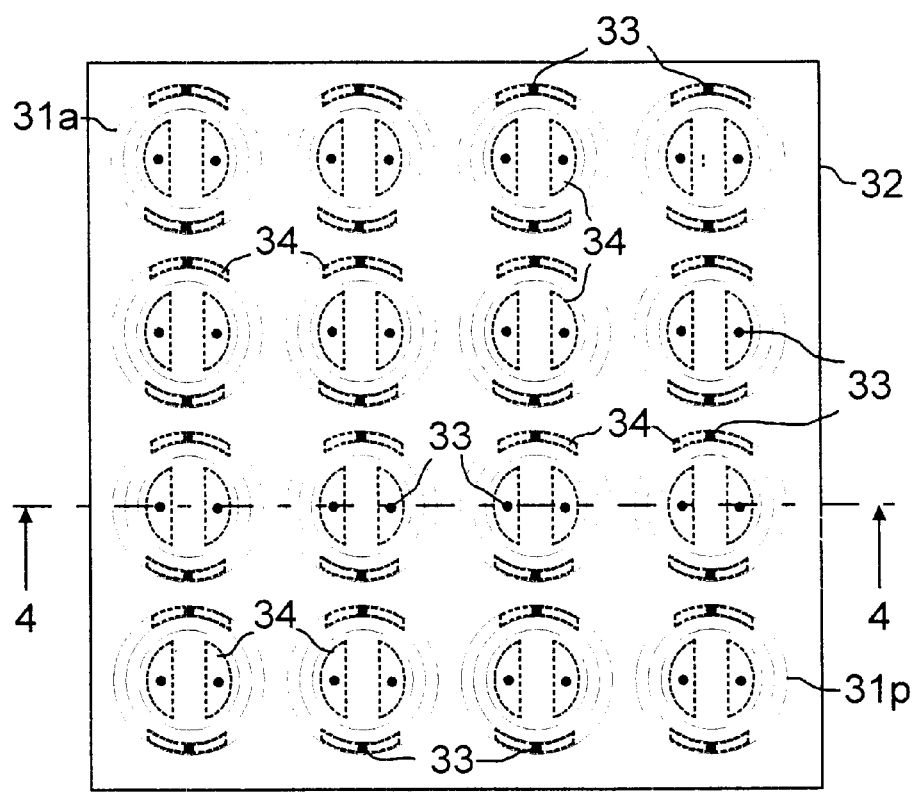
FIG. 3 is a schematic representation similar to that of FIG. 2 showing removal of the micromechanical drive circuit interconnection to the backside of the silicon wafer in accordance with a principle feature of the invention.

With reference to FIG. 3, here the micromechanical mirror devices, 31a–31p, are close packed in a 4×4 array on substrate 32. The substrate is the same size as the substrate used for the 3×3 array of FIG. 2. The more efficient packing arrangement is made possible by routing the interconnections through the silicon substrate. The electrode interconnections that extend through substrate 32 are shown at 33. Electrostatic drive electrodes are shown at 34.

Figure 4:
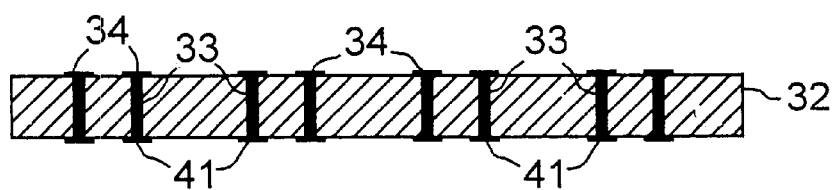
FIG. 4 is a section view through 4—4 of FIG. 3.

The interconnections 33 that extend through the substrate 32 can be seen in FIG. 4, which is section 4—4 of FIG. 3. These openings through the substrate, referred to here as through hole interconnections, are the focus of the invention. The electrostatic drive electrodes are shown at 34. The backside interconnection pads can be seen in FIG. 4 and are designated 41.

Figure 5:
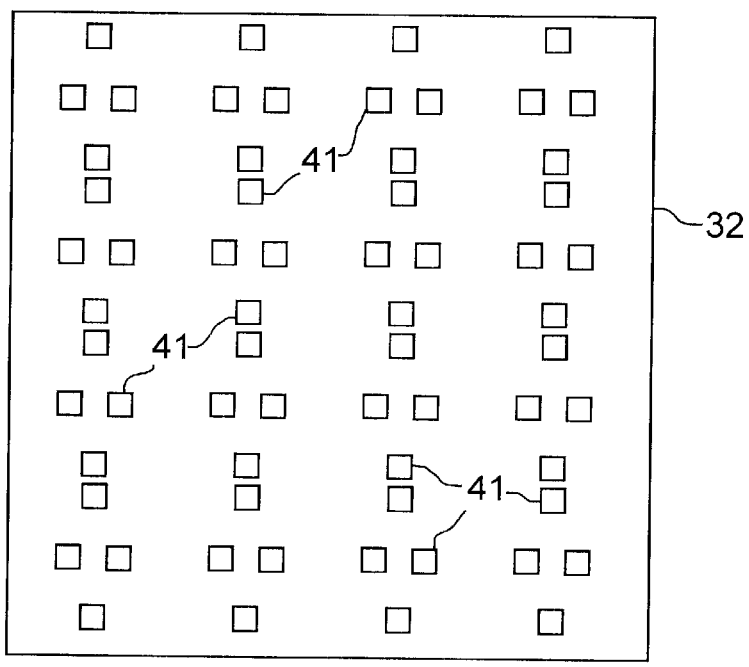
FIG. 5 is a view of the bottom side of the substrate shown in FIGS. 3 and 4.

The bottom side of substrate 32 is shown in plan view in FIG. 5. The array of contact pads designated 41 are formed on the bottom surface of substrate 32 and correspond in position with the bottom of the vias.

Figure 6:
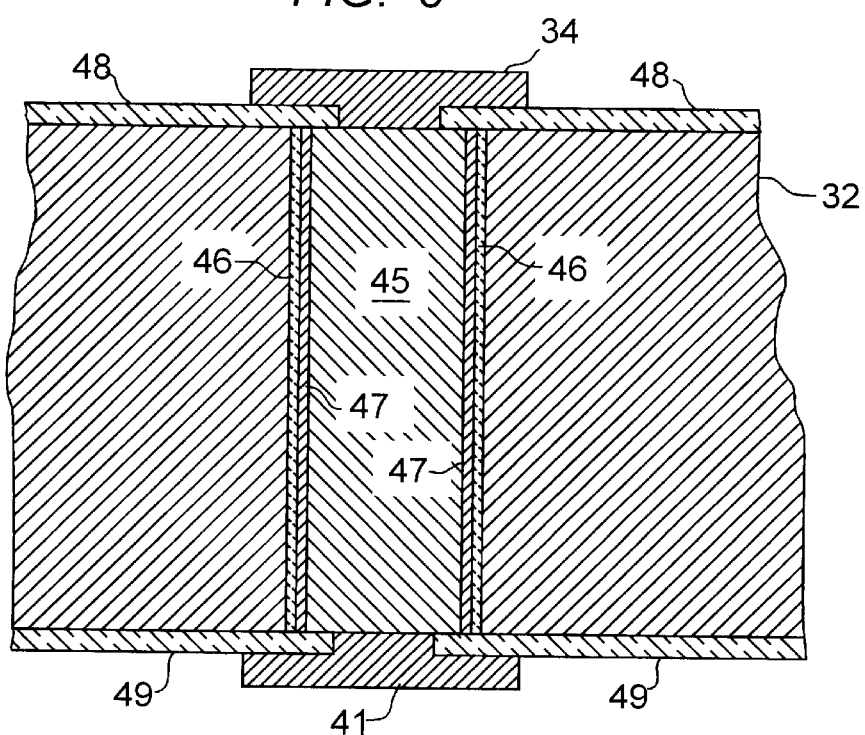
FIG. 6 is a cross section showing one of the vias of FIGS. 3 and 4 in more detail.

The through hole interconnections that extend through the micromechanical device substrate 32 are illustrated in the section view of FIG. 6, which shows one of these vias in more detail. It should be emphasized that the drawings here are not to scale, and the actual through holes have a higher aspect ratio, i.e. an aspect ratio which is greater than 4, and may even be 10 or more.

An electrostatic drive electrode is shown at 34 and the micromechanical device substrate is designated 32 as before. The interconnection through substrate 32 is represented by conductive plug 45. The conductive plug 45 is insulated from the substrate 32 by insulating layer 46. The top and bottom surfaces of the substrate 32 also have insulating layers 48 and 49 respectively. To facilitate the electrolytic deposition on the sidewalls of the holes it is necessary to have a conductive strike layer 47 on the sidewalls. This layer will be discussed in more detail below. The strike layer 47, as formed, is continuous, i.e. it covers the top and bottom surfaces as well as the sidewalls of the hole, to give electrical continuity over the whole wafer. However, in subsequent processing at least portions of it, and typically all of it, will be removed. Therefore the portion of strike layer 47 that is initially on the top and bottom surfaces of wafer 32 does not appear in FIG. 6. Conductor pad 41 is shown on the bottom side of the substrate. Again, It is emphasized that the drawings here are not to scale, and the actual through holes have a higher aspect ratio, i.e. an aspect ratio which is greater than 4, and may even be 10 or more. The aspect ratio is defined as the length of the hole, which corresponds to the thickness of the wafer plus the thickness of the oxide layers 47 on both the top and bottom surfaces and twice the thickness of the strike layer 67, divided by the diameter of the hole, which corresponds to the diameter of the hole etched through the silicon wafer, reduced by twice the thickness of the insulating coating 46, and twice the thickness of the strike layer 47. The latter are relatively thin, i.e. less than a micron, and usually can be disregarded in the aspect ratio calculation.

As already indicated, the size of various elements in the figures is not necessarily to scale. Also, the 3×3, and 4×4, arrays are shown for convenience in exposition. A more typical array, as suggested above, is 32×32 micromechanical devices on a 3.2 cm substrate, which allows an approximate single device size of 1 mm². Also, the array configuration, with x- and y-rows, is by way of example only. Other arrangements, e.g. with alternate rows offset and rows interleaved, may also be used.

The backside of substrate 32, as shown in FIG. 5, has an area array of bond pads 41 arranged for interconnection. Several options are available for interconnecting to sites 41. A standard single level printed circuit may be used as in FIG. 2. Multi-level interconnections can be used to allow crossovers. A preferred choice is to attach an interconnection substrate to substrate 32, with solder bump interconnections made from the interconnection substrate to pads 41. The interconnection substrate may be an intermediate interconnection substrate, or a translator substrate, as described and claimed in U.S. patent applications Ser. Nos. 09/149,803 and 09/149,804, both filed Sep. 8, 1998.

The method of the invention for producing the through hole interconnections shown in FIG. 6 will be described in conjunction with FIGS. 7–25.

Figure 7:
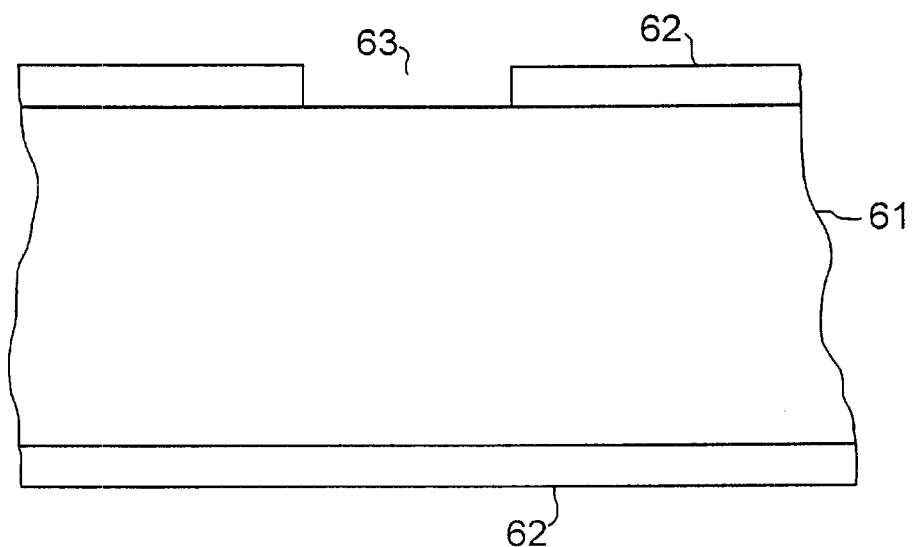
FIGS. 7—24 are representations of processing steps for constructing the interconnect system of the invention.

With reference to FIG. 7, the silicon micromechanical device array substrate is shown at 61. For this application the substrate thickness is of the order of 20 mils, but it should be understood that the substrate may be thinner or thicker. Typical silicon wafers have a thickness of 20–30 mils, and are frequently thinned using conventional thinning techniques to 12 mils or less. For robust micromechanical device platforms, the preferred thickness is 12–30 mils. In practice, the thickness of the wafer scales to some extent with the diameter of the wafer. Small wafer platforms can be made relatively thin, e.g. 3 or 4 inch wafer platforms have sufficient mechanical robustness at a thickness of 12 mils or less. However, large platforms are preferred to accommodate large arrays of devices. Wafer platforms 8 inches or more typically are made with a thickness of 20 mils or more, to allow handling and service without breakage.

Referring again to FIG. 7, the substrate 61 is coated with a photoresist 62, and patterned using standard lithography, to leave mask feature 63. Feature 63 has a dimension corresponding to the width, typically the diameter d, of the through hole. The diameter of feature 63 in the embodiment described here is approximately 50 μm, within an acceptable range for high device packing density of 20–150 μm, and a preferred range of 30–100 μm. For the very high aspect ratio through holes to which this invention applies, i.e. greater than 4, the minimum wafer thickness range corresponding to the broad (acceptable) hole diameter range would calculate to be 80 μm. However, for other reasons outlined above, the minimum wafer thickness t to which this invention preferably applies is 300 μm. Designating the aspect ratio "A", the thickness t of the wafer, and the diameter d of the through hole, follow the expression:

$$A = d/t$$

where A is greater than 4, and preferably greater than 6, d is in the range 20–150 μm, preferably 30–100 μm, and t is in the range 300–750 μm, preferably 500–750 μm.

For the selective area processing described in conjunction with FIG. 7, the preferred lithography technique is photolithography, which is the practical choice for producing such large features. However, other lithography techniques such as electron beam or x-ray, or even ink printing, may be used.

The mask 62 in FIG. 7 may be a photoresist mask, as just described, but is preferably a hard mask, e.g. of $SiO_2$, AlN, $W_xN$, or other suitable hard mask material. The hard mask may be deposited by CVD or other suitable technique.

Figure 8:
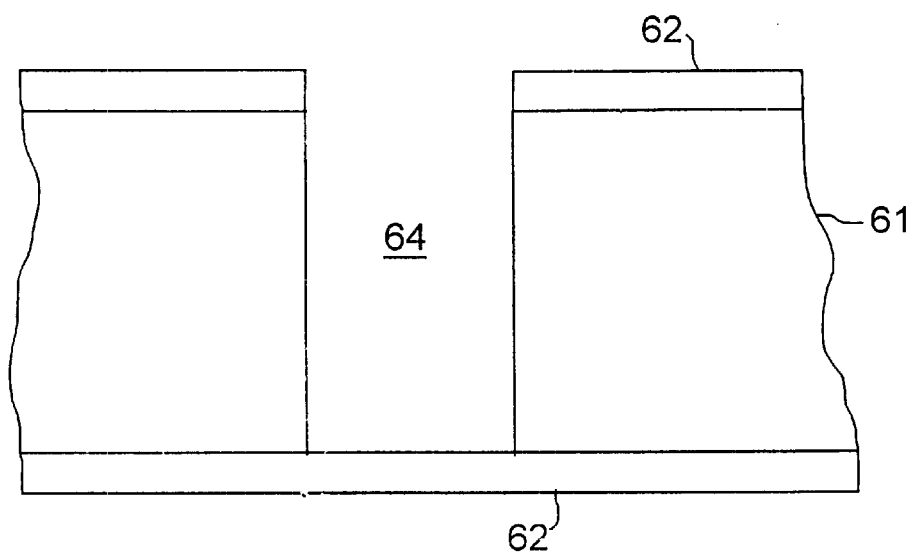

Using mask layer 62 as the etch mask, the wafer is exposed to a deep Reactive Ion Etch (RIE) to produce the structure shown in FIG. 8. As is well known, standard RIE etch processes produce openings, as shown at 64 in FIG. 8, with steep, essentially vertical, sidewalls.

Figure 9:
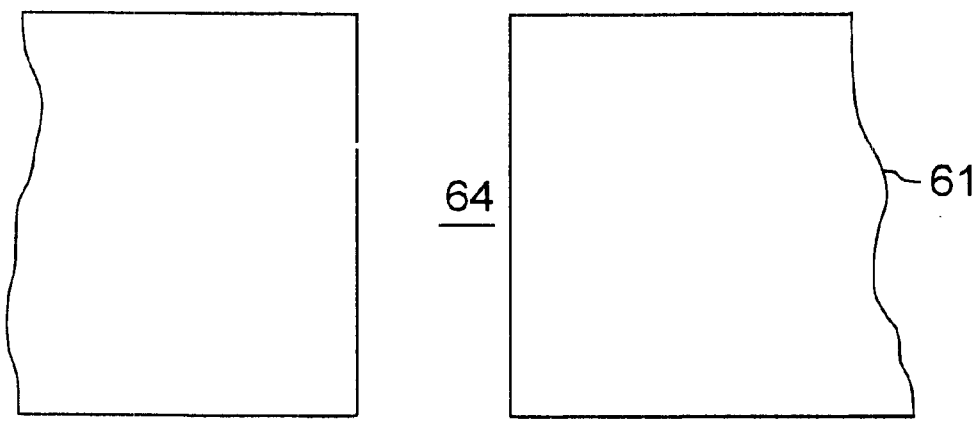
Figure 10:
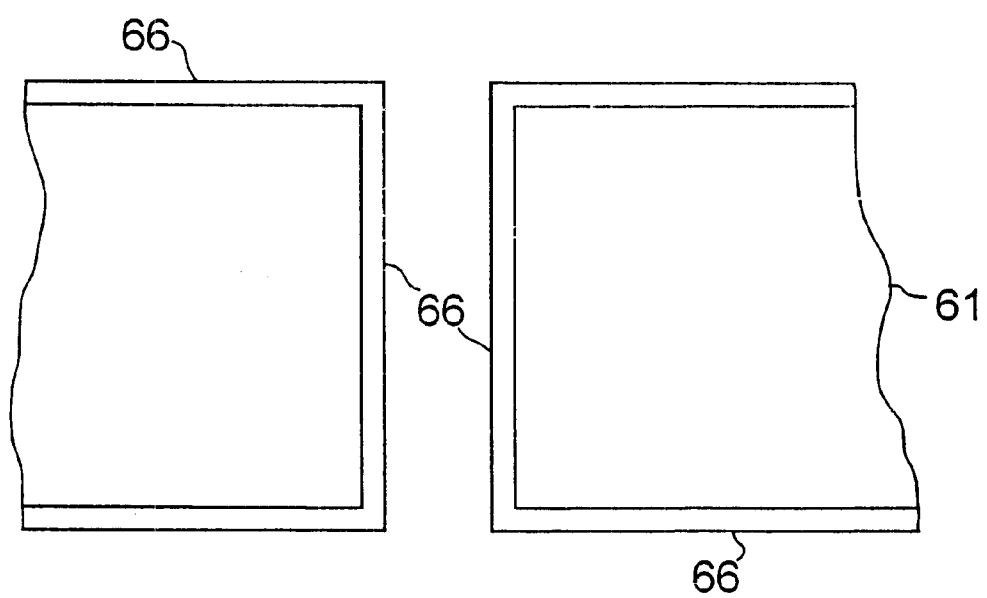

The mask may then be stripped as represented by FIG. 9, and the wafer oxidized to grow thermal oxide layer 66 on all exposed surfaces, and especially the sidewalls of the through holes, as shown in FIG. 10. If a hard mask is used, it may remain in place and the sidewalls of the through hole oxidized. The thickness of the grown oxide layer is typically 0.5–3 μm, and serves simply to electrically isolate the through holes from the substrate and from other through holes.

Figure 11:
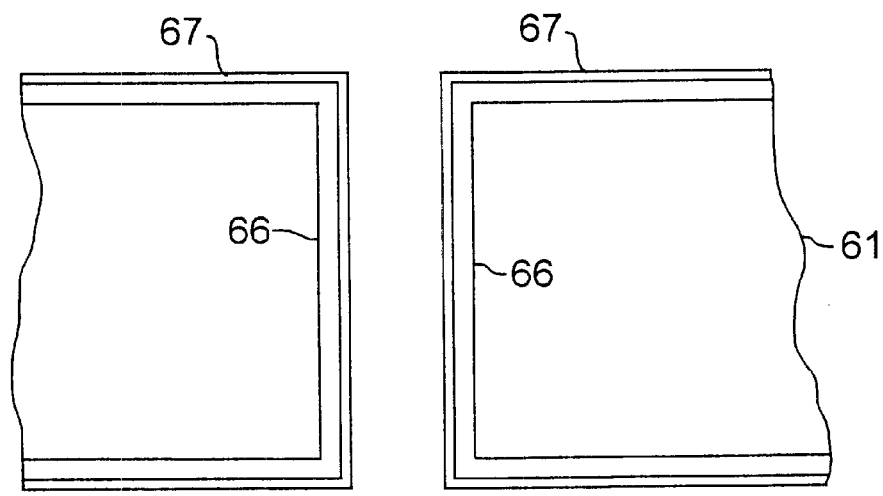

With reference to FIG. 11, a strike layer 67 is deposited on the wafer and onto the sidewalls of the through holes as shown. The strike layer serves three important functions: 1. it is an adhesion layer to improve adhesion between the conductive fill material to be deposited later; 2. it is a barrier layer for preventing migration of the conductive fill material into other regions of the device; 3. it is a cathode layer for providing a continuous electrode on the sidewalls of the through holes and interconnecting the through holes. The material that serves all three functions according to the invention is tungsten(W), tungsten nitride ($W_xN$) or $W/W_xN$. Subscript x may be in the range 2 to 19. The strike layer may be deposited by Chemical Vapor Deposition (CVD), Plasma Enhanced CVD (PECVD), or other suitable method. CVD types of methods are preferred because they are capable of producing highly conformal coatings. The thickness of the strike layer may be in the range 500–5000 Angstroms. For details of a suitable tungsten deposition process, see Journal of the Electrochemical Society, April 1959, p. 305 et. seq. For depositing a tungsten nitride barrier layer see Conference Proceedings ULSI XIV, Materials Research Society, pp. 297–311. These references are incorporated herein by reference for essential processing details.

Figure 12:
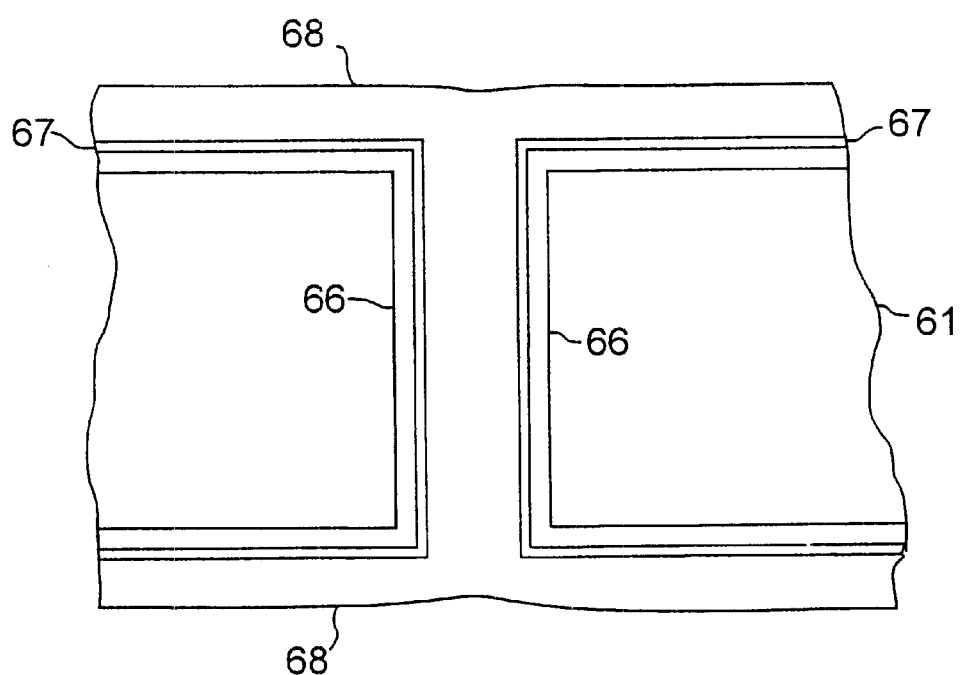

The conductive plug is then electroplated over the strike layer and into the through holes as shown in FIG. 12. The electroplated layer is shown at 68 and, for complete filling of the via hole, has a thickness preferably greater than the radius of the via remaining after oxidation plus an added factor of at least 10%. That thickness will typically be in the range 30–100 μm. The portion of the conductive layer 68 that extends above the surface of substrate 61, and the surface portion of layer 67, are removed by grinding or polishing using standard wafer thinning or chemical mechanical polishing (CMP) techniques. Polishing is stopped at the oxide layer 66, leaving the surface portion of oxide layer 66 intact. Both sides of substrate 61 are polished to produce the structure shown in FIG. 13. For convenience this operation, in whatever form used, is referred to as a planarizing step. It may be useful, in some processes, to partially remove the conductive fill layer during planarization, and pattern the remainder of this layer for interconnection.

It is important to remove either all of the surface portion of layer 67, the strike layer, or use the expedient just mentioned, i.e. pattern the surface portion of layers 67 and 68 for interconnection. Otherwise unwanted conductive paths will extend between through holes.

Figure 14:
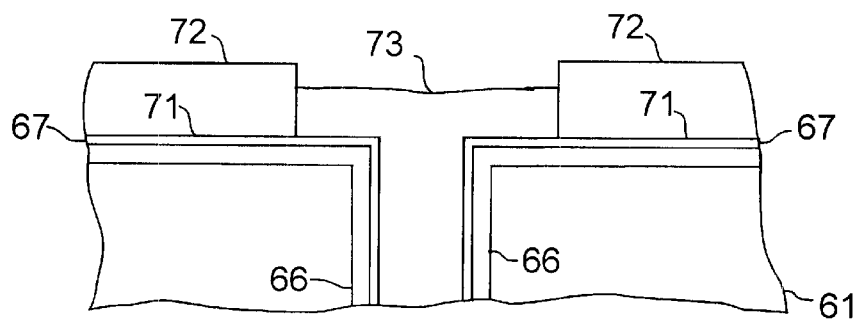

In some cases it may be found that removal of the large excess of deposited layer 68 is inconvenient or difficult. A preferred technique for avoiding excess plating on areas of the wafer where it is not needed is to mask those areas with photoresist. This is illustrated in FIG. 14 where just the top portion of a typical through hole site is shown. The regions 71 where plating is not needed and is to be avoided are coated with photoresist layer 72. The plated layer 73 is then confined to the regions where it is desired.

An alternative step sequence that reduces the amount of excess is to partially plate layer 68, then reverse the polarity of the electrodeposition and deplate the surface portion of layer 68. The surface portion may be removed at a faster rate than the portion in the through holes. This process of electrochemical planarization is described for example in PCT Publication WO 90/13908.

Figure 15:
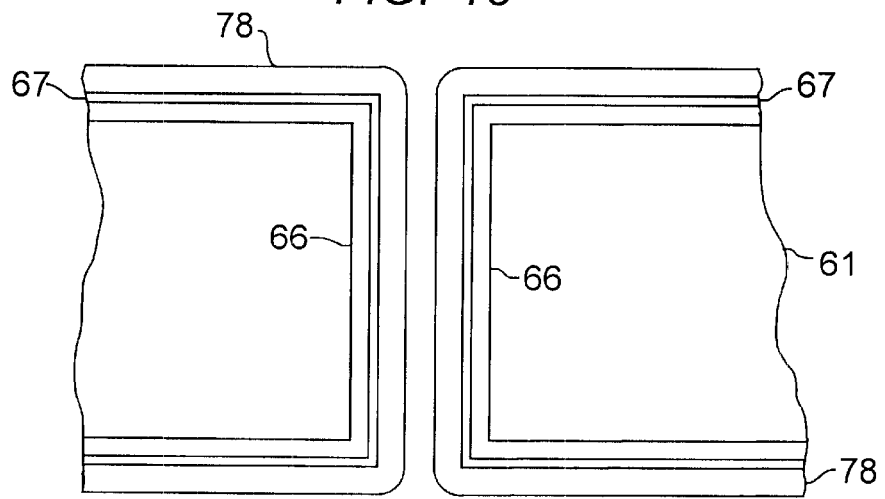
Figure 16:
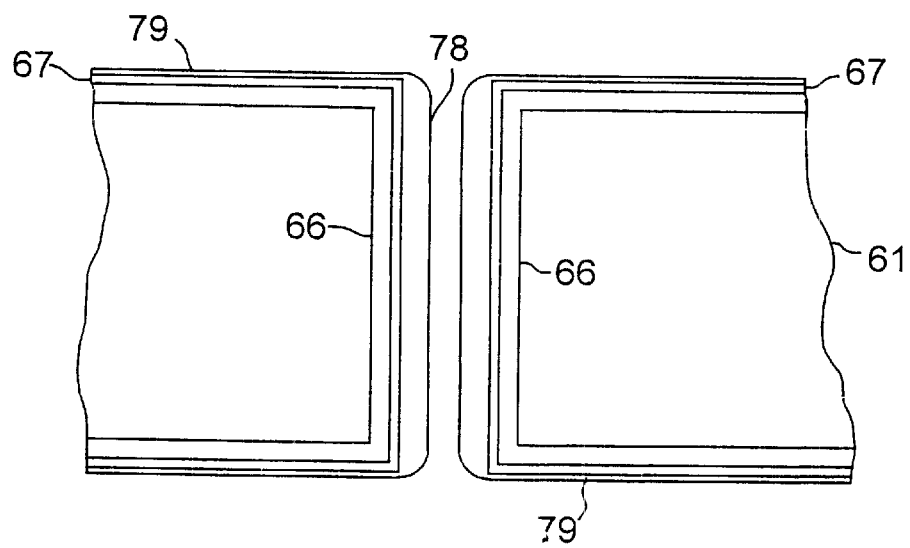
Figure 17:
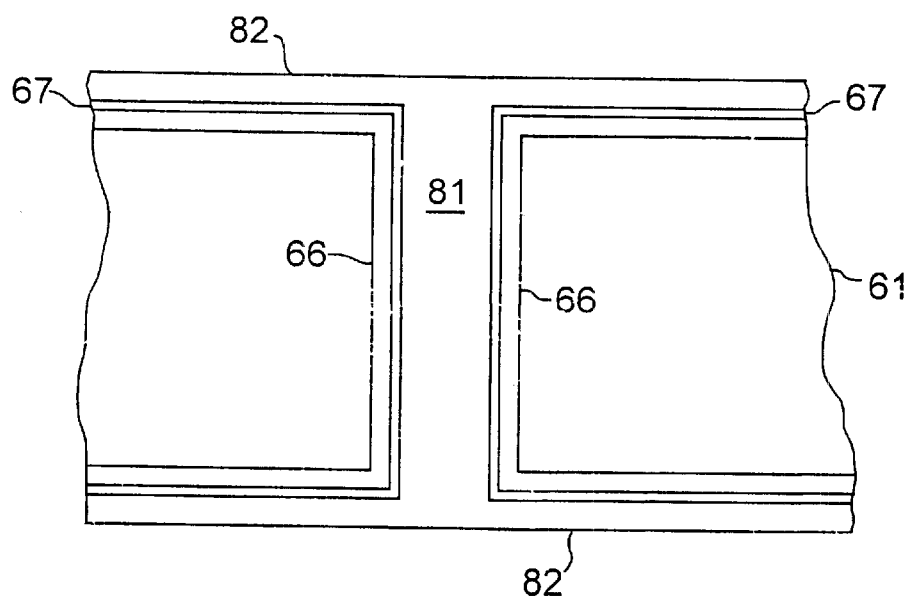

FIG. 15 shows plating of fill layer 78 to approximately one half thickness. Part of the surface portion of layer 79 is shown removed, by the technique just described, in FIG. 16. The completed fill layer comprising plug 81 and surface portion 82 is shown deposited in FIG. 17. It is evident that the surface portion 82 is reduced compared with the surface portion of layer 68 in FIG. 12, thus permitting more effective or easier removal. Plug portion 81 remains after planarization and appears the same as the structure shown in FIG. 13.

Figure 18:
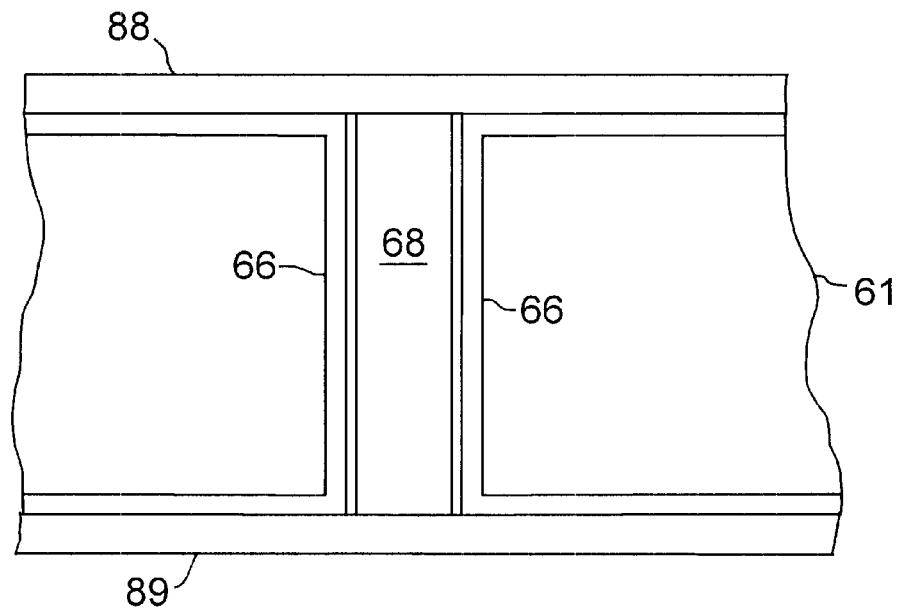
Figure 19:
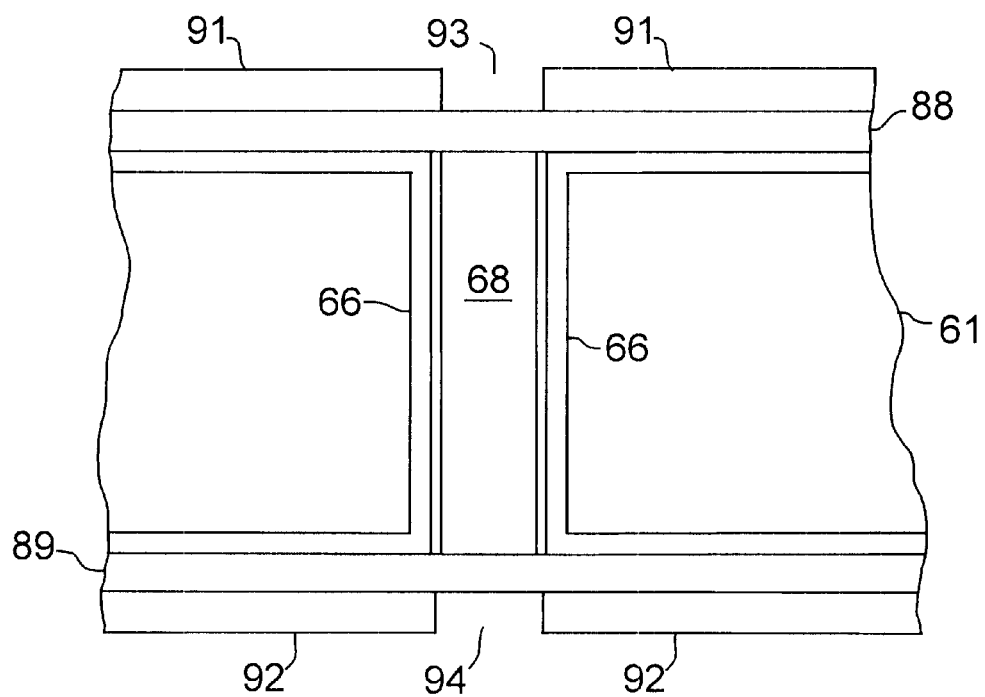
Figure 20:
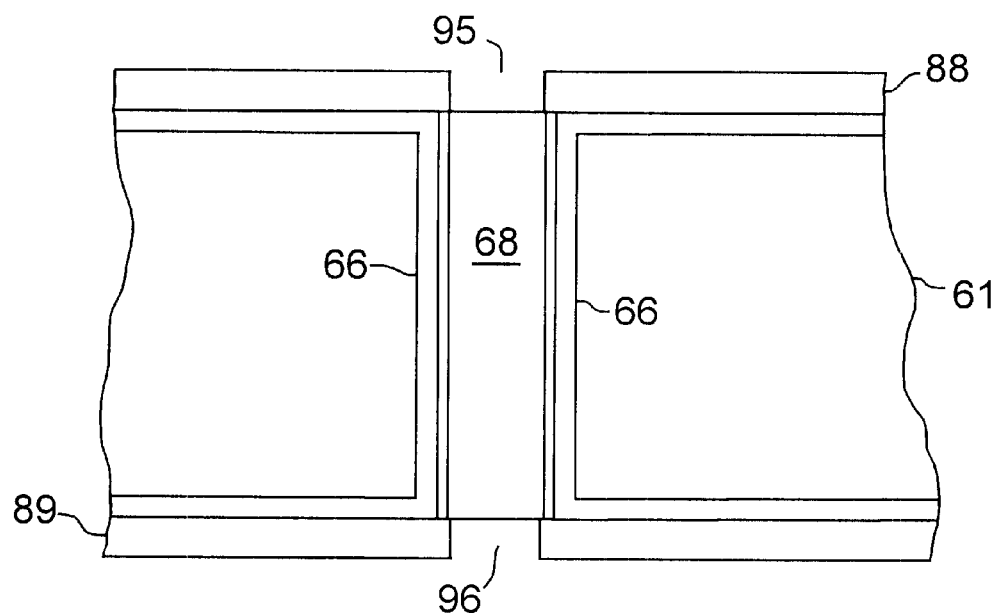

After the substrate planarizing step, a low temperature CVD deposition of silicon nitride is performed to produce nitride surface layers 88 and 89 on the top and bottom surfaces respectively of the substrate, as shown in FIG. 18. The thickness of this nitride layer may be in the range 0.1 to 1 microns. The nitride layers 88 and 89 are then masked with photomasks 91 and 92 as shown in FIG. 19, with openings 93 and 94 defining a feature that will expose the conductive plug 68. Mask features 93 and 94 have a diameter greater than the diameter of conductive plug for reasons that will become apparent. The exposed portions of the oxide layers are etched, using a standard BOE wet etch, or using a dry etch e.g. RIE, to produce contact windows 95 and 96 as shown in FIG. 20. To avoid shorting the contacts, to be deposited later, to substrate 61, the windows may be reoxidized after opening to grow a surface oxide on any exposed substrate material. A photomask is then applied to expose a center portion of the conductive plug and the oxide on the plug that is produced by the reoxidation step is removed by standard etching.

Figure 21:
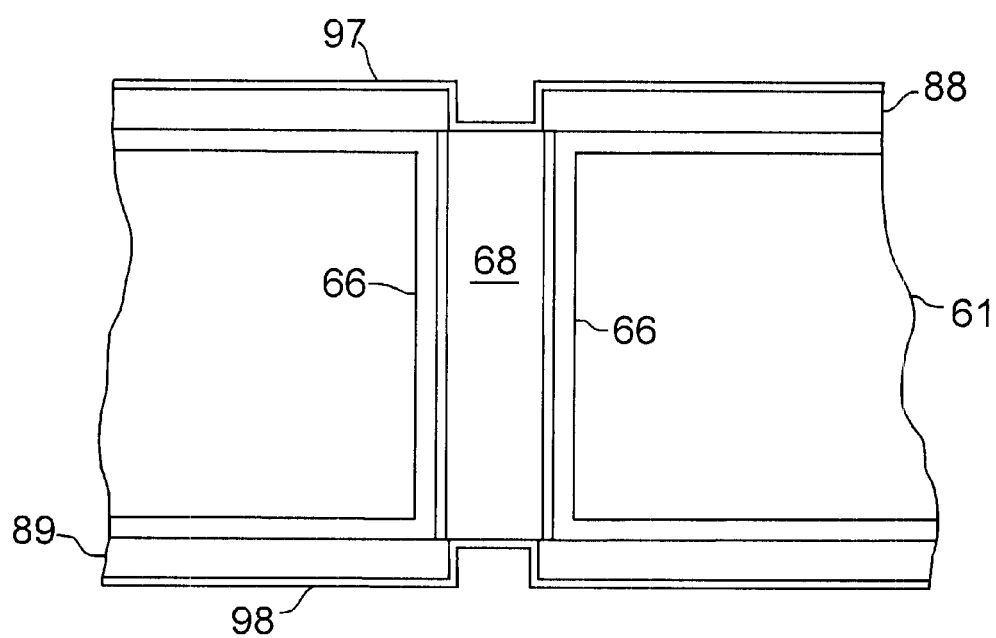

A barrier layer 97, 98 is then deposited over the structure as shown in FIG. 21. The barrier layer may be W, $W_xN_x$, Ti,TiN, Ta, TaN, or other suitable material. It may be most convenient to form layer 97, 98 in the same way, and of the same material, as strike layer 67 (FIG. 11). In combination with the strike layer 67 already lining the sidewall of the through holes, the barrier layer prevents unwanted migration of the plug material into other regions of the device. The thickness of the barrier layer in not critical and may be, for example, 0.5 to 5.0 microns. To be effective, it is important that it cover the entire plug.

Figure 22:
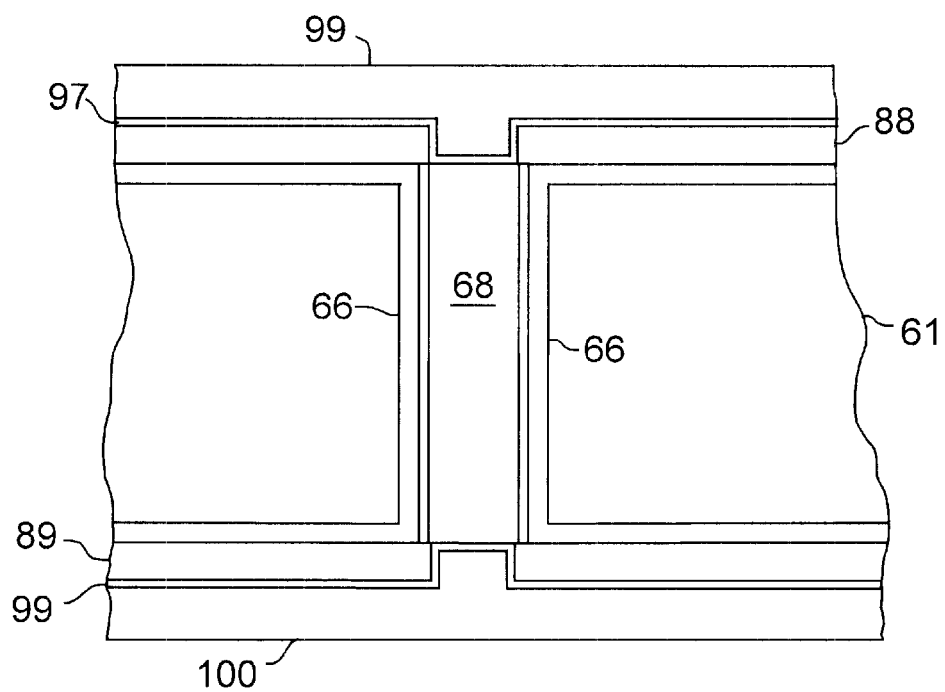
Figure 23:
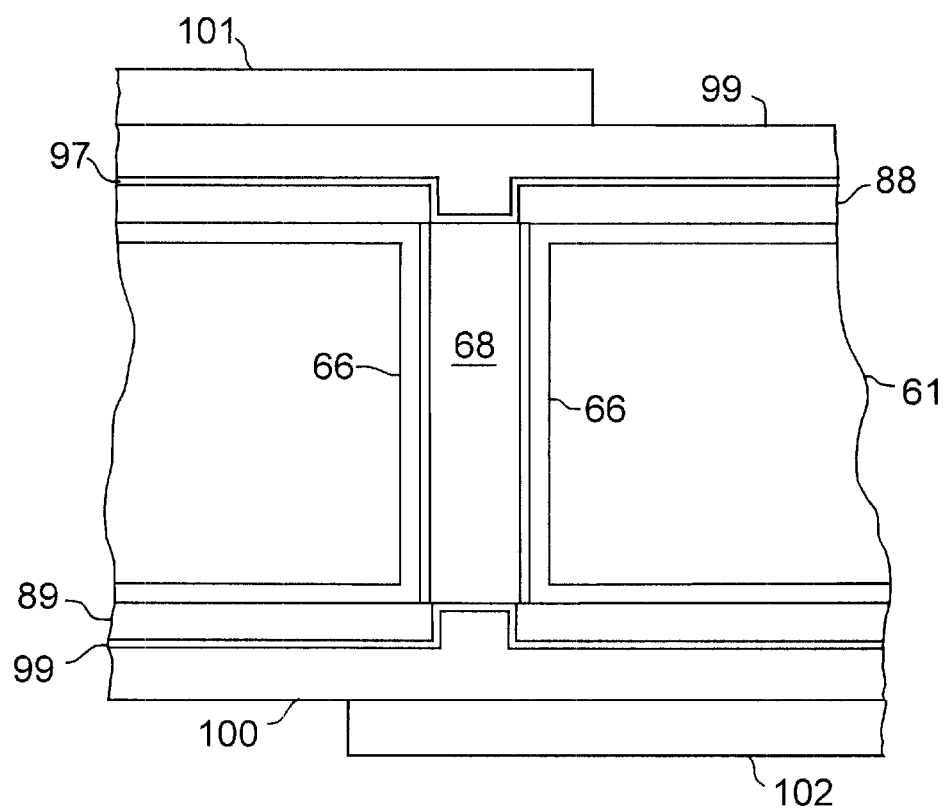
Figure 24:
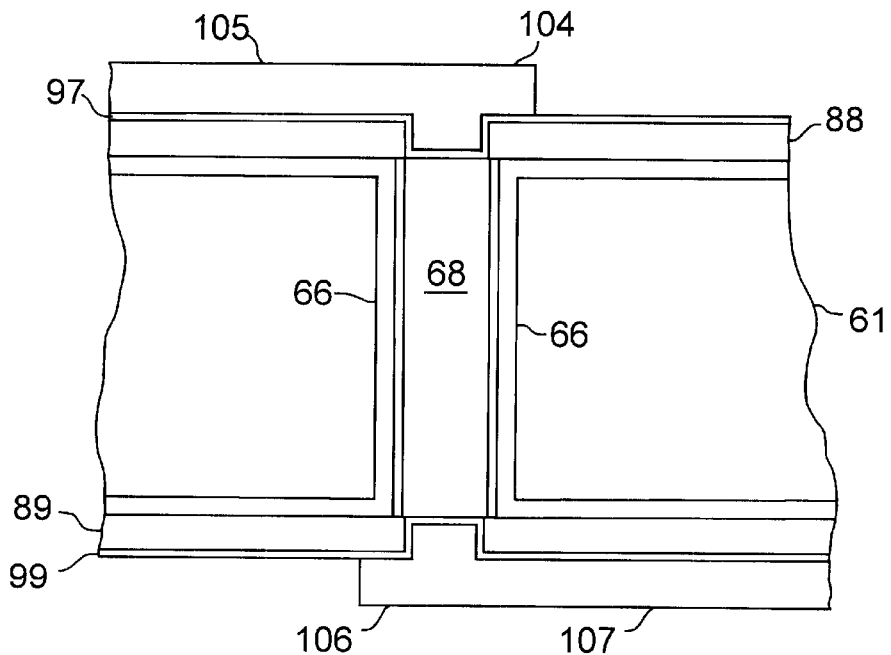

A contact layer 99, 100, which may be any suitable contact material, e.g. 0.5–5.0 microns of aluminum, is deposited over the top and bottom of substrate 61 as shown in FIG. 22. The contact layer is masked with photomasks 101 and 102 as illustrated in FIG. 23, to define contacts which, after etching the contact layer and the exposed barrier layer, and removing the photomask, appear at 104 and 106 in FIG. 24. Contact 104 corresponds to electrostatic electrode 34 (FIGS. 3, 4, 6), and contact 106 corresponds to electrode 41 (FIGS. 5, 6). This layer may also be patterned to provide an interconnection layer, in which case runners 105 and 107 in FIG. 24 represent the interconnections between through holes and other elements of the circuit.

As an alternative, well known lift-off techniques can be used to produce the metallization for the contacts 104 and 106.

Figure 25:
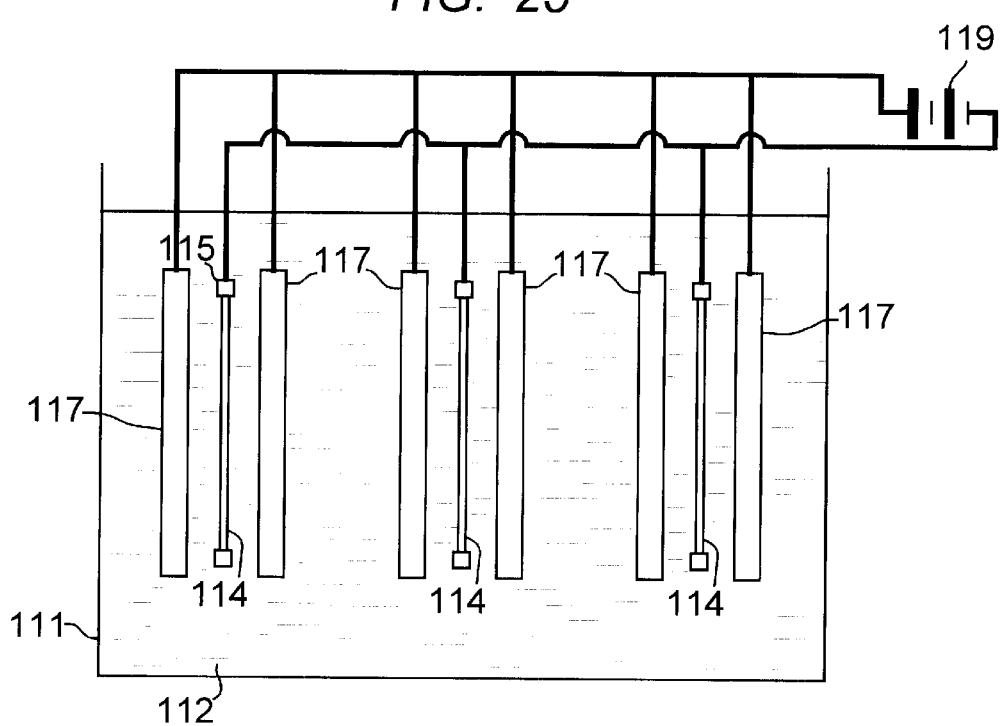
FIG. 25 is a schematic representation of an electrolytic apparatus useful for carrying out the method of the invention.

The conductive plugs 68 are formed, according to this embodiment of the invention, by electroplating conductive fill layer 68 in FIG. 12 onto the strike layer 67. A schematic view of a suitable plating apparatus is shown in FIG. 25. It should be understood that this figure shows various elements as representative parts of the apparatus and are schematic only. A variety of more sophisticated plating cell apparatus are available in the art for performing the electroplating operation. FIG. 25 shows plating tank 111 with electrolyte 112. The silicon wafer workpieces are designated 114 and are shown suspended vertically. To avoid entrainment of air upon introducing the wafers into the electrolyte horizontal orientation may be used. Agitation is also recommended. The silicon wafers are provided with full circumference electrodes 115 to evenly distribute the current density around the wafer. Anodes are shown at 117 on each side of each workpiece. The silicon wafers are connected electrically as shown with DC source 119.

The following examples are given to demonstrate the invention. For copper conductive plugs:

EXAMPLE I

Silicon wafers, processed to the stage represented by FIG. 10, are placed in a vacuum apparatus and 2000 angstroms of tungsten is deposited by CVD to form a strike layer. The through holes in the silicon wafer are initially approximately 60 microns in diameter. For good adhesion of copper to tungsten it is preferred that the tungsten surface first be pretreated. For example, the tungsten layer is subjected to a cathodic treatment to evolve hydrogen which removes any native oxide and hydrides the tungsten surface. A nickel strike layer can then be deposited.

The wafers are then mounted with a ring electrode in an electrolytic apparatus as shown schematically in FIG. 25. The Cu plating bath is as follows:

| | |
|---|---|
| Cu Sulfate (CuSO$_4$.5H$_2$O) | 70 g/L |
| Sulfuric acid (H$_2$SO$_4$) | 175 g/L |
| Cl | 70 ppm |
| polyethylene glycol (suppressor) | 300 ppm |
| mercaptopropane sulfonic acid (accelerator/brightener) | 50 ppm |

A copper layer approximately 40 microns thick is deposited using the following plating conditions:

current density: 15 mAmp/cm$^2$
temp: 25° C.
Cu anode (bagged)

Figure 13:
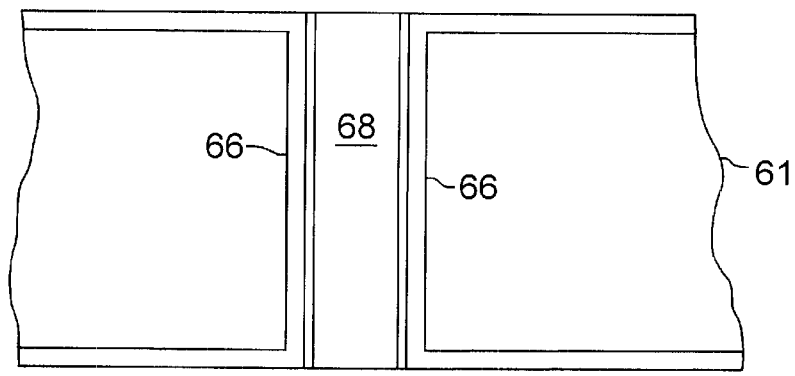

The resulting structure has through holes that are plugged with copper. Excess copper and the strike layer on the surface of the wafer are removed using standard CMP (FIG. 13). A silicon nitride layer with a thickness of 0.5 micron is deposited over the surface of the structure (FIG. 18) and contact window formed by standard lithography and etching. A TiN barrier layer is formed by conventional reactive sputtering and the contact completed as described above.

For through holes filled with nickel the following procedure is recommended.

EXAMPLE II

Silicon wafers, processed to the stage represented by FIG. 10, are placed in a vacuum apparatus and 2000 angstroms of tungsten is deposited by CVD, then pretreated and plated with nickel to form a strike layer as in Example I. The through holes in the silicon wafer are initially approximately 40 microns in diameter. The wafers are then mounted with a ring electrode in an electrolytic apparatus as shown schematically in FIG. 25. The Ni plating bath is as follows:

| | |
|---|---|
| Ni Sulfamate (NiSO$_3$NH$_2$)$_2$ | 450 g/L |
| Boric Acid (H$_3$BO$_3$) | 30 g/L |
| surfactant for wetting (lauryl sulfate) | 3 g/L |

A nickel layer approximately 25 microns thick is deposited using the following plating conditions:

current density: 3 mA/cm$^2$
temp: 55° C.
Ni anode (bagged)
N$_2$ bubbling through solution for agitation The resulting structure has through holes that are plugged with nickel. Excess nickel and the strike layer on the surface of the wafer are removed using standard CMP (FIG. 13). A silicon nitride layer with a thickness of 0.5 micron is deposited over the surface of the structure (FIG. 18) and contact window formed by standard lithography and etching. A TiN barrier layer is formed by conventional reactive sputtering and the contact completed as described above.

Following the technique of the invention the conductive vias formed by the copper or nickel plugs will be fully functional even if small voids form in the plugs. The initial deposit of metal will effectively cover all of the sidewalls of the through holes. Only after the initial coating of the sidewalls, as metal builds up and begins to close the hole, is there a likelihood of voids forming. At this point the required conductive path is completed, and small voids impart no deleterious effect.

In the embodiments described above, a single micromechanical device array chip is shown. However, as will occur to those skilled in the art, the substrate may contain several or many flip-chip sites for micromechanical device array chips depending on the size of the assembly and the size of the various elements. The technique used for the flip-chip bond is not part of the invention and may e.g. be solder bump or ball bonding, or conductive epoxy etc.

With the substrate processed to the stage represented by FIG. 24, the micromechanical device array is formed or mounted on the top surface of an interconnection substrate. For some device arrays, devices that are already essentially complete may be attached to the substrate. In other embodiments the device array may be formed, i.e. built, on the substrate. In either case, referred to generically as forming the device array on the top side of the substrate, electrical contacts associated with the device array are interconnected typically by printed circuit runners to the conductive vias on the top side of the substrate. An interconnection pattern, formed on the bottom side of the substrate, is interconnected to the bottom side of the vias.

In the embodiments described above, the micromechanical device array is formed on just one side of the substrate with the other side of the substrate comprising interconnection means. However, embodiments can be envisioned wherein micromechanical elements are provided on both sides of the substrate. Also, a logical extension of the invention described above would be to attach two substrates with micromechanical arrays as described in a chip-on-chip configuration. The chip-on-chip arrangement, in the case where the micromechanical array is optically active, i.e. has an optical input/output, should be configured to allow optical access to the device array.

It will also occur to those skilled in the art that while all the electrode interconnections in the embodiment shown in FIG. 3 are made through the substrate, a combination of top side and bottom side interconnections can easily be adapted to take advantage of the principles of the invention.

It should be understood that in the foregoing description of the process embodiments, and in the claims below, the process steps do not necessarily have to be performed in the sequence stated. However, normally the processing of the semiconductor substrate to form the vias will occur at the beginning. The printed circuit interconnections will normally be formed second, and the completion of the device array last. The printed circuits typically comprise electrical contacts on the top side of the substrate at the attachment sites for the device array, and an interconnection pattern, i.e. the runners in the printed circuit, for interconnecting the electrical contacts for the device array and the conductive vias. On the bottom side of the substrate the substrate interconnections will typically comprise runners from the conductive vias to interconnection pads for, for example, wire bond or solder bond interconnection to the next level. The next level may be a ceramic, epoxy or silicon interconnection substrate, or may be an IC chip as suggested earlier. The bond pads on the bottom of the substrate may be referred to as interlevel bond pads to include these various options. The bond pads for solder bump attachment will typically include under bump metallization.

Reference to CVD below is intended to include the various well known forms of chemical vapor deposition including LPCVD and PECVD. Reference to printed circuit below is intended to refer to metallization patterns, typically aluminum, formed by standard printed circuit techniques, either additive or subtractive.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. Method for the manufacture of a micromechanical device array in which the device array is supported by a semiconductor substrate, the substrate having a top side and a bottom side and a thickness t, comprising the steps of:

(a) forming a plurality of holes through the semiconductor substrate, each of the plurality of holes having an essentially cylindrical shape with an essentially tubular cylindrical sidewall, the plurality of holes having a diameter d, where d and t are related by:

$$A + d/t$$

where A is the aspect ratio of the holes and is greater than 4, (b) forming an insulating layer on the cylindrical sidewall,
(c) depositing an electrically conductive barrier layer on the insulating layer, the top side of the substrate and the bottom side of the substrate, (d) depositing conductive plugs in the plurality of holes to completely fill the holes and form a plurality of conductive vias, said conductive plugs comprising a metal selected from the group consisting of copper and nickel deposited by the steps of:
  (i) placing the substrate in an electrolyte comprising ions of the metal of the conductive plug,
  (ii) placing an anode in the electrolyte,
  (iii) applying a DC bias between the anode and the substrate with the substrate biased negative, to deposit metal on said barrier layer,
  (iv) continuing to apply the DC bias until the metal completely fills the holes to form the conductive plugs,
  (v) removing portions of the barrier layer between the conductive plugs, and
  (vi) depositing a barrier layer over the conductive plugs.

2. The method of claim 1 wherein the semiconductor is silicon.

3. The method of claim 2 further including the steps of:
(e) forming top side interconnection means on the top side of the substrate interconnecting device array attachment sites and the plurality of conductive vias,
(f) forming bottom side interconnection means on the bottom side of the substrate, the bottom side interconnection means comprising interlevel bond pads and runners interconnecting the interlevel bond pads with the plurality of conductive vias, and
(g) attaching the device array on the top side of the semiconductor substrate.

4. The method of claim 1 wherein the device array is an optical device array.

5. The method of claim 1 wherein d is in the range 20–125 $\mu$m, and t is in the range 300–750 $\mu$m.

6. The method of claim 5 wherein A is greater than 5, d is in the range 30–80 $\mu$m, and t is in the range 500–750 $\mu$m.

7. Method for the manufacture of a device array in which the device array is supported by a silicon substrate, the silicon substrate having a top side and a bottom side and a thickness t, comprising the steps of:
(a) forming a plurality of conductive vias through the silicon substrate, the plurality of conductive vias having a diameter d, where d and t are related by:

$A = d/t$ where A is the aspect ratio of the holes and is greater than 4, d is in the range 20–150 $\mu$m, and t is in the range 300–750 $\mu$m, the plurality of conductive vias further comprising a metal selected from the group consisting of copper and nickel, the conductive vias formed by the steps of:
  (i) masking the silicon substrate leaving openings for the conductive vias,
  (ii) etching the silicon substrate in the openings by RIE to form holes extending completely through the silicon substrate, the holes having essentially vertical sidewalls,
  (iii) oxidizing the silicon substrate to form an oxide layer on the sidewalls,
  (iv) depositing a barrier layer on the insulating layer, the top side of the substrate and the bottom side of the substrate,
  (v) placing the substrate in an electrolyte comprising ions of the metal of the conductive plug,
  (vi) placing an anode in the electrolyte,
  (vii) applying a DC bias between the anode and the substrate with the substrate biased negative, to deposit metal on said barrier layer,
  (viii) continuing to apply the DC bias until the metal completely fills the holes to form the conductive plugs, and
  (ix) depositing a barrier layer over the metal, and
  (x) planarizing the top surface of the silicon substrate, leaving the plurality of conductive vias through the silicon substrate.

8. The method of claim 7 including the additional steps of
(b) forming a top side printed circuit on the top side of the silicon substrate interconnecting device array attachment sites and the plurality of conductive vias,
(c) forming a bottom side printed circuit on the bottom side of the silicon substrate, the bottom side printed circuit comprising interlevel bond pads and runners interconnecting the interlevel bond pads with the plurality of conductive vias, and
(d) attaching the device array on the top side of the silicon substrate.

9. The method of claim 7 wherein A is greater than 6, d is in the range 30–100 $\mu$m, and t is in the range 500–750 $\mu$m.

10. The method of claim 7 wherein the openings are circular with a diameter in the range 30–100 microns.

11. The method of claim 7 wherein the substrate has a thickness in the range 20–30 mils.

12. The method of claim 9 wherein the printed circuits comprise aluminum.

13. The method of claim 1 including step before step (d) (i) of masking portions of substrate between the plurality of holes.

14. The method of claim 13 wherein the portions are masked with photoresist.

* * * * *